US010404211B1

(12) United States Patent
Civerolo et al.

(10) Patent No.: US 10,404,211 B1
(45) Date of Patent: Sep. 3, 2019

(54) TECHNIQUES AND METHODS OF SPOT NOISE GENERATION UTILIZING A POLYPHASE SYNTHESIZER

(71) Applicant: The United States of America as represented by the Secretary of the Navy, San Diego, CA (US)

(72) Inventors: Michael Civerolo, San Diego, CA (US); Nicholas Johnson, San Diego, CA (US); Nicholas A. Lumsden, Escondido, CA (US); Christopher L. Lichtenberg, Carlsbad, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/001,539

(22) Filed: Jun. 6, 2018

(51) Int. Cl.
*H03B 29/00* (2006.01)
*H03H 17/02* (2006.01)

(52) U.S. Cl.
CPC ......... *H03B 29/00* (2013.01); *H03H 17/0213* (2013.01); *H03H 17/0273* (2013.01)

(58) Field of Classification Search
CPC ..... H04K 3/00–94; H04K 2203/00–36; H03B 29/00; H03H 17/0213; H03H 17/0273; G01S 7/38
See application file for complete search history.

(56) References Cited

U.S. PATENT DOCUMENTS

| 6,005,888 A | 12/1999 | Barron |
| 6,445,714 B1 | 9/2002 | d'Anjou et al. |
| 7,123,182 B1 * | 10/2006 | Childs ...................... G01S 7/38 342/14 |
| 7,346,165 B2 | 3/2008 | Seo et al. |

OTHER PUBLICATIONS

F. J. Harris, "Multirate Signal Processing for Communication Systems", Prentice-Hall, pp. 106-126, 2004.
Proakis, J, et al., "Digital Signal Processing Principles, Algorithms, and Applications 4th Ed," Prentice-Hall, pp. 74, 454-457, 2007.

* cited by examiner

*Primary Examiner* — Raymond S Dean
(74) *Attorney, Agent, or Firm* — Naval Information Warfare Center, Pacific; Kyle Eppele (57) ABSTRACT

A spot noise generator includes a mask component, a polyphase synthesizer, a first signal channel and second signal channel. The mask component has a narrowband noise input, a desired frequency channels word input, a first channel output and a second channel output. The narrowband noise input signal is a digital narrowband noise signal sampled approximately at the Nyquist rate. The desired frequency channels word selects one of the group consisting of the first channel output, the second channel output and a combination of the first channel output and the second channel output. The polyphase synthesizer synthesizes the first channel output signal, synthesizes the second channel output signal and outputs a desired noise signal based on the synthesized first channel output signal and the synthesized second channel output signal.

20 Claims, 10 Drawing Sheets

TECHNIQUES AND METHODS OF SPOT NOISE GENERATION UTILIZING A POLYPHASE SYNTHESIZER

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 3600, San Diego, Calif., 92152; telephone (619)553-3001; email: ssc_pac_t2@navy.mil. Reference Navy Case No. 103,534.

BACKGROUND OF THE INVENTION

Embodiments of the invention relate to spot noise generators.

Radio-frequency (RF) noise generators are used in many commercial and military applications for testing and communications purposes. It is often desirable to generate noise within certain "spots," or bands, in a given RF spectrum. Prior art spot noise generators have relied on methods that are computationally expensive or exhibit poor spectral performance.

There exists a need for a spot noise generator that is computationally efficient and creates a clean power-efficient spectrum.

SUMMARY OF THE INVENTION

Aspects of the present disclosure provide a spot noise generator that is computationally efficient and creates a clean power-efficient spectrum.

An aspect of the present disclosure is drawn to a spot noise generator including a mask component, a polyphase synthesizer, a first signal channel and a second signal channel. The mask component has a narrowband noise input, a desired frequency channels word input, a first channel output and a second channel output. The narrowband noise input is operable to receive a narrowband noise input signal. The desired frequency channels word input is operable to receive a desired frequency channels word. The first channel output is operable to output a first channel output signal. The second channel output is operable to output a second channel output signal. The narrowband noise input signal is a digital narrowband noise signal sampled approximately at the Nyquist rate. The desired frequency channels word is operable to select one of the group consisting of the first channel output, the second channel output and a combination of the first channel output and the second channel output. The polyphase synthesizer is operable to synthesize the first channel output signal, to synthesize the second channel output signal and to output a desired noise signal based on the synthesized first channel output signal and the synthesized second channel output signal. The first signal channel is operable to provide the first channel output signal from the first channel output to the polyphase synthesizer. The second signal channel is operable to provide the second channel output signal from the second channel output to the polyphase synthesizer.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

Aspects of the present disclosure provide a spot noise generator that is computationally efficient, creates a clean power-efficient spectrum, and allows real-time modification of the output spectrum.

RF noise is used in military and commercial applications where RF tests or transmissions require a certain level of intentional noise at desired frequency bands. Limiting the noise to specific frequency bands saves amplifier power and prevents interference from adjacent channels. Prior art methods of generating spot noise suffer from several disadvantages: some methods are computationally expensive and do not allow the spectrum to be changed in real-time, while other methods exhibit poor out-of-band performance and waste amplifier power. There exists a need for generating spot noise that is computationally efficient, creates a clean power-efficient spectrum, and is dynamically tunable.

Aspects of the present disclosure will now be further described with reference to FIGS. 1A-10B.

Figure 1A:
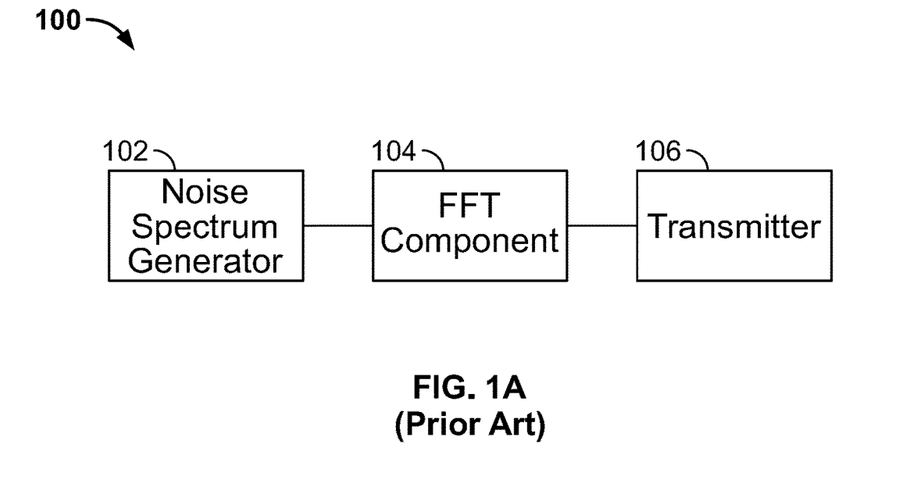
FIGS. 1A-B illustrate prior art spot noise generators.
Figure 1B:
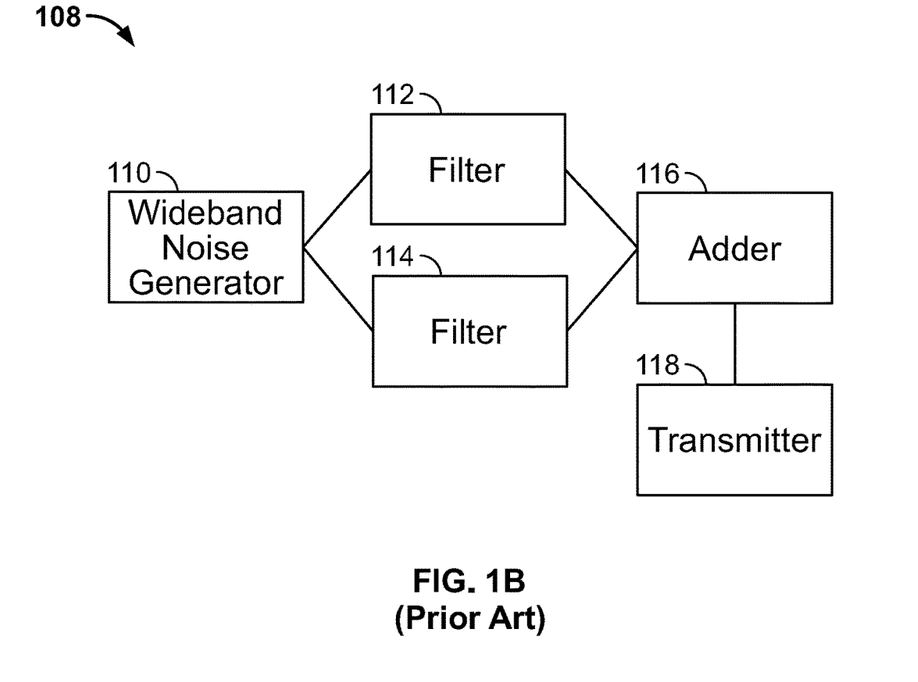

FIGS. 1A-B illustrate prior art spot noise generators 100 and 108.

FIG. 1A illustrates spot noise generator 100 that uses a computationally efficient method to translate a desired spot noise frequency response to a time-domain waveform.

As shown in the figure, spot noise generator 100 contains a noise spectrum generator 102, a Fast Fourier Transform (FFT) component 104, and a transmitter 106. Noise spectrum generator 102 generates a desired spot noise signal in the frequency domain. FFT component 104 converts a frequency-domain signal into a time-domain signal. Transmitter 106 converts and amplifies a digital input signal into an analog RF signal.

Spot noise generator 100 uses minimal filtering to increase efficiency, but this results in an output spectrum with large amplitudes of undesired frequencies, and therefore poor isolation and wasted amplifier power.

FIG. 1B illustrates spot noise generator 108 that uses multiple digital filters and mixers to create the desired spot noise output.

As shown in the figure, spot noise generator 108 contains a wideband noise generator 110, filters 112 and 114, an adder 116, and a transmitter 118. Wideband noise generator 110 generates a noise signal over a wide spectrum of frequencies. Filters 112 and 114 are digital filters that define the desired passbands of the output noise spectrum. Adder 116 combines multiple input signals into a single output signal. Transmitter 118 converts and amplifies a digital input signal into an analog RF signal.

The quality of filters 112 and 114 is directly related to the number of coefficients in filters 112 and 114. A large number of weighting coefficients results in good filter characteristics such as low ripple in the passband, sharp transitions, and high out-of-band rejection. However, increasing the number of weighting coefficients also increases the computational load.

Filters 112 and 114 each define a spot noise frequency channel. Therefore, spot noise generator 108 as illustrated in FIG. 1B generates two spot noise channels. Each additional spot noise band requires another filter; to generate a noise spectrum with five spots requires five filters.

FIGS. 1A-B illustrate prior art spot noise generators. Aspects of a spot noise generator using a polyphase synthesizer will now be discussed with reference to FIGS. 2-4.

Figure 2:
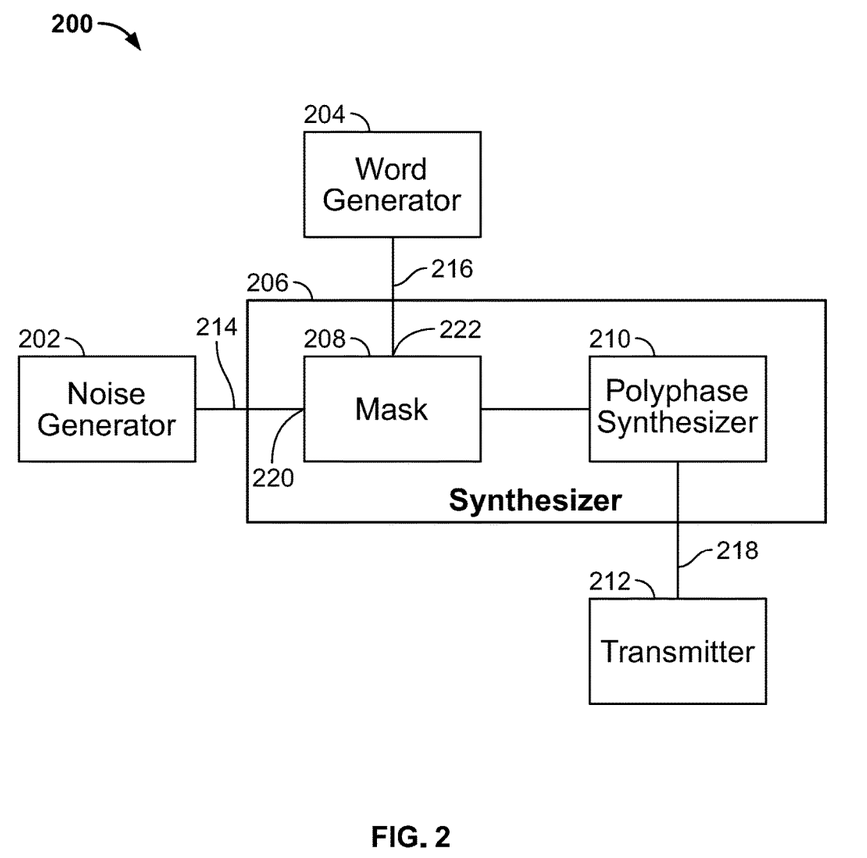
FIG. 2 illustrates a spot noise generator in accordance with aspects of the present disclosure.

FIG. 2 illustrates a spot noise generator 200 in accordance with aspects of the present disclosure.

As shown in the figure, spot noise generator 200 contains a narrowband noise generator 202, a desired frequency channels word generator 204, a synthesizer block 206, and a transmitter 212.

In this example, narrowband noise generator 202, desired frequency channels word generator 204, synthesizer block 206, and transmitter 212 are illustrated as individual devices. However, in some embodiments, at least two of narrowband noise generator 202, desired frequency channels word generator 204, synthesizer block 206, and transmitter 212 may be combined as a unitary device.

Further, in some embodiments, at least one of narrowband noise generator 202, desired frequency channels word generator 204, synthesizer block 206, and transmitter 212 may be implemented as non-transitory, tangible, computer-readable media having computer-readable instructions stored thereon, the computer-readable instructions being capable of being read by a computer and being capable of instructing the computer to perform a method of generating a spot noise signal. Such tangible computer-readable media can be any available media that can be accessed by a general purpose or special purpose computer. Non-limiting examples of tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. For information transferred or provided over a network or another communications connection (either hardwired, wireless, or a combination of hardwired or wireless) to a computer, the computer may properly view the connection as a computer-readable medium. Thus, any such connection may be properly termed a computer-readable medium. Combinations of the above should also be included within the scope of computer-readable media.

Synthesizer block 206 contains a mask component 208 and a polyphase synthesizer 210.

Mask component 208 includes a narrowband noise input 220 and a desired frequency channels word input 222.

Synthesizer block 206 accepts a narrowband noise input signal 214 from narrowband noise generator 202 and a desired frequency channels word 216 from desired frequency channels word generator 204. More specifically, narrowband noise input 220 is operable to receive narrowband noise input signal 214 and desired frequency channels word input 222 is operable to receive desired frequency channels word 216. Synthesizer block 206 generates a desired noise signal 218.

Narrowband noise generator 202 is any device or method that generates an arbitrary noise signal within a narrow frequency band.

Desired frequency channels word generator 204 is any device or method that creates a description of desired noise signal 218. In this non-limiting example, desired frequency channels word generator 204 generates desired frequency channels word 216, where desired frequency channels word 216 is a binary mask corresponding to center frequencies of possible frequency bands of desired noise signal 218.

Transmitter 212 is any device or method that converts desired noise signal 218 into an analog RF signal.

Aspects of synthesizer block 206 will now be discussed with reference to FIG. 3.

Figure 3:
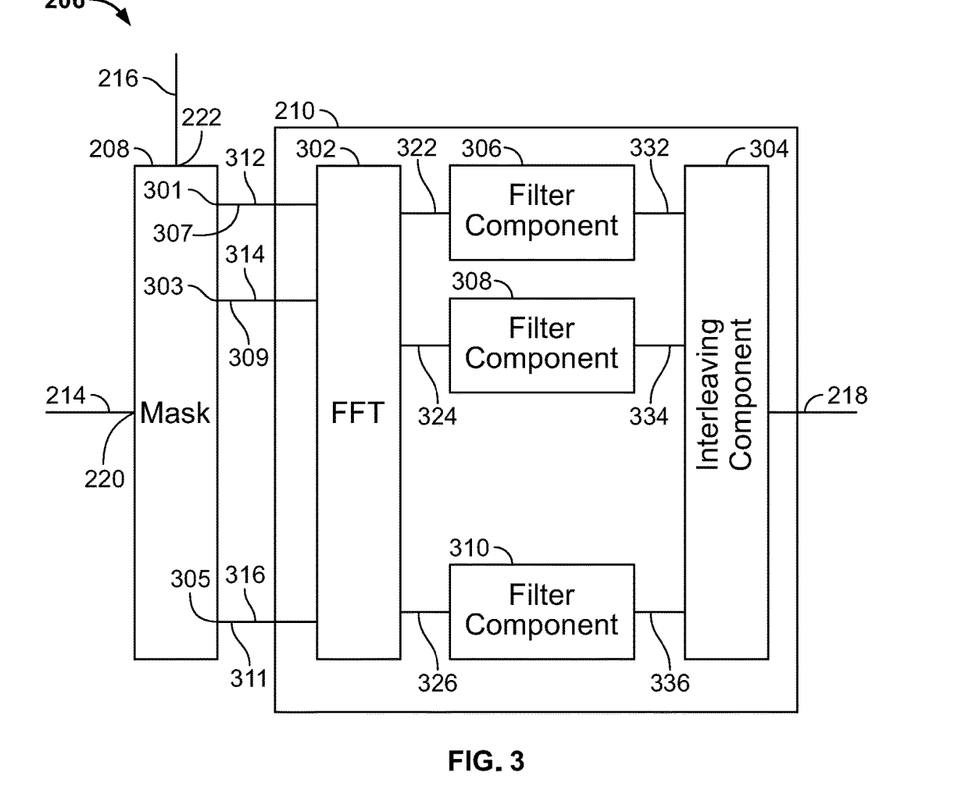
FIG. 3 illustrates a synthesizer block in accordance with aspects of the present disclosure.

FIG. 3 illustrates synthesizer block 206 in accordance with aspects of the present disclosure.

As shown in the figure, synthesizer block 206 contains mask component 208, polyphase synthesizer 210, a first signal channel 307, a second signal channel 309 and an/V" signal channel 311.

Mask component 208 includes a first channel output 301 that is operable to output a first channel output signal 312, a second channel output 303 that is operable to output a second channel output signal 314 and an $N^{th}$ channel output 305 that is operable to output an $N^{th}$ channel output signal 316.

First signal channel 307 is operable to provide first channel output signal 312 to polyphase synthesizer 210. Second signal channel 309 is operable to provide second channel output signal 314 to polyphase synthesizer 210. $N^{th}$ signal channel 311 is operable to provide $N^{th}$ channel output signal 316 to polyphase synthesizer 210.

Polyphase synthesizer 210 is operable to synthesize a first channel output signal, a second channel output signal and an $N^{th}$ channel output signal and to output a desired noise signal based on the synthesized signals. Polyphase synthesizer 210 contains an FFT component 302, an interleaving component 304, a first polyphase filter component 306, a second polyphase filter component 308, and an $N^{th}$ polyphase filter component 310.

Mask component 208 provides first channel output signal 312, second channel output signal 314, and $N^{th}$ channel output signal 316 to FFT component 302. FFT component 302 provides a first transformed signal 322 to first polyphase filter 306, which then provides a first polyphase filter signal 332 to interleaver 304. FFT component 302 provides a second transformed signal 324 to second polyphase filter 308, which then provides a second polyphase filter signal 334 to interleaver 304. FFT component 302 provides an $N^{th}$ transformed signal 326 to $N^{th}$ polyphase filter 310, which then provides an $N^{th}$ polyphase filter signal 336 to interleaver 304.

Mask component 208 is any device or method that distributes narrowband noise input signal 214 among N outputs. Mask component 208 uses desired frequency channels word 216 to individually enable or disable first channel output signal 312, second channel output signal 314, or $N^{th}$ channel output signal 316. Mask component 208 can use a different value of desired frequency channels word 216 to enable or disable a different combination of first channel output signal 312, second channel output signal 314, or $N^{th}$ channel output signal 316.

FFT component 302 is any device or method that performs a Fast Fourier Transform on N inputs and results in N outputs.

First polyphase filter component 306, second polyphase filter component 308, and $N^{th}$ polyphase filter component 310 are any device or method that applies a filter to an input signal and results in a transformed output signal.

Interleaver 304 is any device or method that takes multiple input signals and combines them in time into one output signal. In this non-limiting example, interleaver 304 takes N input signals, each at a low sampling rate, and combines them into one output signal at N times the input sampling rate.

In operation, spot noise generator 200 maps narrowband noise input signal 214 into any of N frequency bands, each frequency band being of equal bandwidth and having different center frequencies. Narrowband noise generator 202 generates narrowband noise input signal 214, which is sampled near its Nyquist rate. Desired frequency channels word generator 204 generates desired frequency channels word 216, which describes all the center frequencies onto which narrowband noise input signal 214 is copied. Mask component 208 uses desired frequency channels word 216 to present a set of narrowband noise channels to synthesizer block 210. Synthesizer block 210 combines N narrowband channels into desired noise signal 218, which is a single wideband signal. Transmitter 212 converts desired noise signal 218 into an analog RF signal.

Synthesizer block 206 can be seen as a single high-coefficient lowpass filter which is designed for good passband, transition, and stopband characteristics. The coefficients of the single lowpass filter are commutated among the polyphase filters where the $N^{th}$ filter receives the weighting coefficients n, N+n, 2N+n, and so on. In this non-limiting example, first polyphase filter 306 receives weighting coefficients 1, N+1, 2N+1, and so on; second polyphase filter 308 receives weighting coefficients 2, N+2, 2N+2, and so on; and $N^{th}$ polyphase filter 310 receives weighting coefficients N, N+N, 2N+N, and so on.

Desired noise signal 218 has a sampling rate of $f_s$. The structure of spot noise generator 200 lets each polyphase path operate at a sampling rate of $f_s/N$; that is, first channel output signal 312, second channel output signal 314, $N^{th}$ channel output signal 316, first transformed signal 322, second transformed signal 324, $N^{th}$ transformed signal 326, first polyphase filter signal 332, second polyphase filter signal 334, and $N^{th}$ polyphase filter signal 336 all operate at a sampling rate of $f_s/N$. Narrowband noise input signal 214 also has a sampling rate of $f_s/N$.

Polyphase synthesizer 210 requires both positive and negative frequencies; hence for N polyphase paths, there are N/2 possible positive frequency spots.

If the single high-coefficient lowpass filter has M coefficients, then first polyphase filter 306, second polyphase filter 308, and $N^{th}$ polyphase filter 310 each have M/N coefficients.

FIGS. 2-3 illustrate spot noise generator 200. A process for generating spot noise will now be discussed with reference to FIG. 4.

Figure 4:
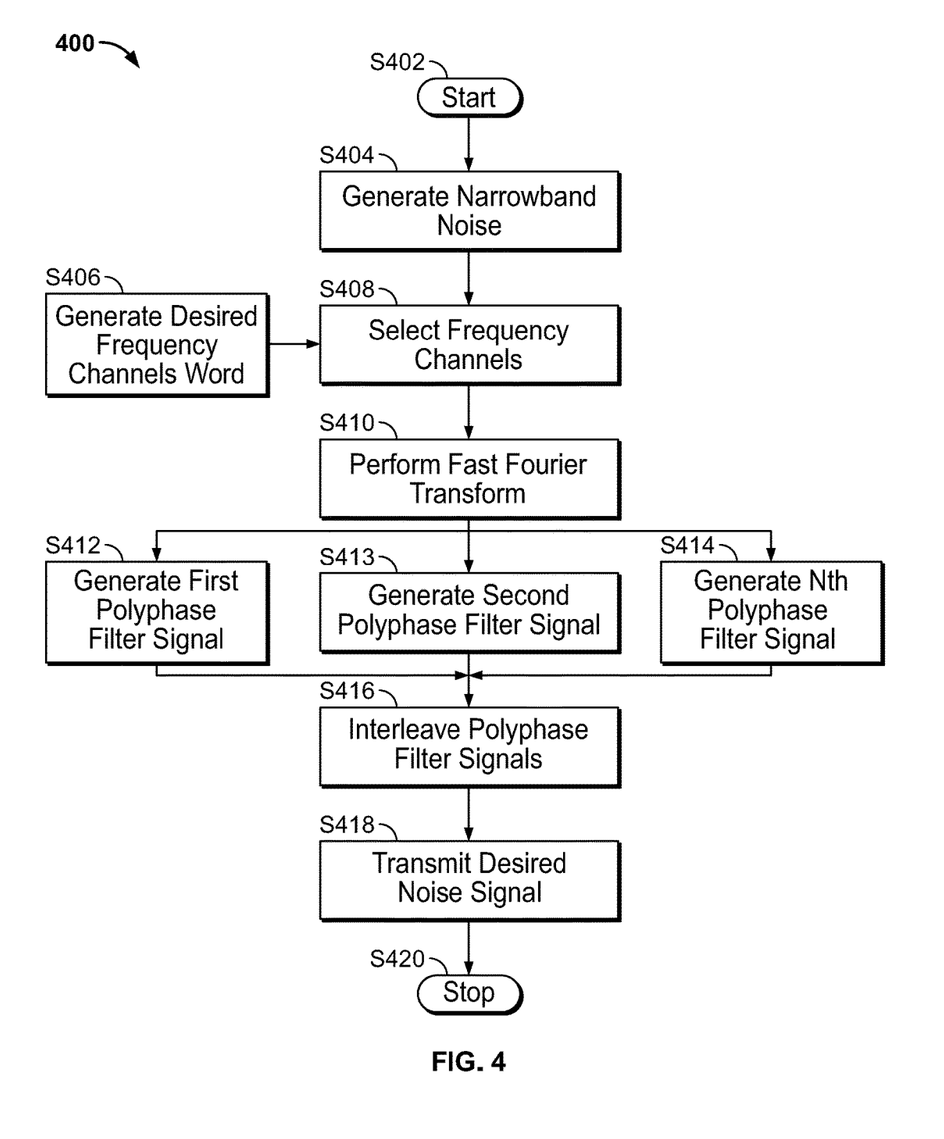
FIG. 4 illustrates a process to generate spot noise in accordance with aspects of the present disclosure.

FIG. 4 illustrates process 400 to generate spot noise in accordance with aspects of the present disclosure.

Process 400 starts (S402). Narrowband noise generator 202 generates narrowband noise input signal 214 at a sampling rate of $f_s/N$ (S404). Desired frequency channels word generator 204 generates desired frequency channels word 216 (S406), which describes all the center frequencies onto which narrowband noise input signal 214 is copied.

Mask component 208 copies narrowband noise input signal 214 into polyphase channels corresponding to the desired center frequencies and outputs the selected channels to FFT component 302 (S408).

FFT component 302 performs a Fast Fourier Transform (S410). As shown in FIG. 3, FFT component 302 is operable to receive first channel output signal 312, to receive second channel output signal 314, to receive $N^{th}$ channel output signal 316; to perform a fast Fourier transform on first channel output signal 312, to perform a fast Fourier transform signal on second channel output signal 314, to perform a fast Fourier transform on $N^{th}$ channel output signal 316, to output first transformed signal 322 based on first channel output signal 312, to output second transformed signal 324 based on second channel output signal 314 and to output $N^{th}$ transformed signal 326 based on $N^{th}$ channel output signal 316.

First polyphase filter 306 has a first weighting coefficient and is operable to generate first polyphase filter signal 332 based on first transformed signal 322 and the first weighting coefficient (S412). Second polyphase filter 308 has a second weighting coefficient and is operable to generate second polyphase filter signal 334 based on second transformed signal 324 and the second weighting coefficient (S413). $N^{th}$ polyphase filter 310 has an $N^{th}$ weighting coefficient and is operable to generate $N^{th}$ polyphase filter signal 336 based on $N^{th}$ transformed signal 326 and the $N^{th}$ weighting coefficient (S414).

Interleaver 304 is operable to output desired noise signal 218 by interleaving first polyphase filter signal 332, second polyphase filter signal 334 and $N^{th}$ polyphase filter signal 336. In other words, interleaver 304 combines first polyphase filter signal 332, second polyphase filter signal 334, and $N^{th}$ polyphase filter signal 336 and outputs desired noise signal 218 (S416).

Transmitter 212 converts and amplifies desired noise signal 218 into an analog RF signal (S418) and process 400 stops (S420).

FIGS. 2-4 illustrate a system and method for generating spot noise. Simulation results of an example embodiment of spot noise generator 200 will now be discussed with reference to FIGS. 5A-10B.

In the example embodiment that is discussed with reference to FIGS. 5A-10B, narrowband noise input signal 214 is designed to have a bandwidth of 1 MHz, centered around 0 Hz. Its Nyquist sampling rate, which is the same as the $f_s/N$ sampling rate, is 1 Msps. The chosen number of possible output frequency spots is 100, which corresponds to center frequencies of 0 MHz to 99 MHz in 1 MHz steps. In other words, in an example embodiment, mask component 208 is operable to output each first channel output signal having a frequency resolution of approximately 1 MHz. N is twice the number of desired center frequencies and is therefore set at 200. Since $f_s/N=1$ Msps and N=200, there are 200 polyphase paths and a 200-point FFT. Desired noise signal 218 is generated with a sampling rate of 200 Msps.

Figure 5A:
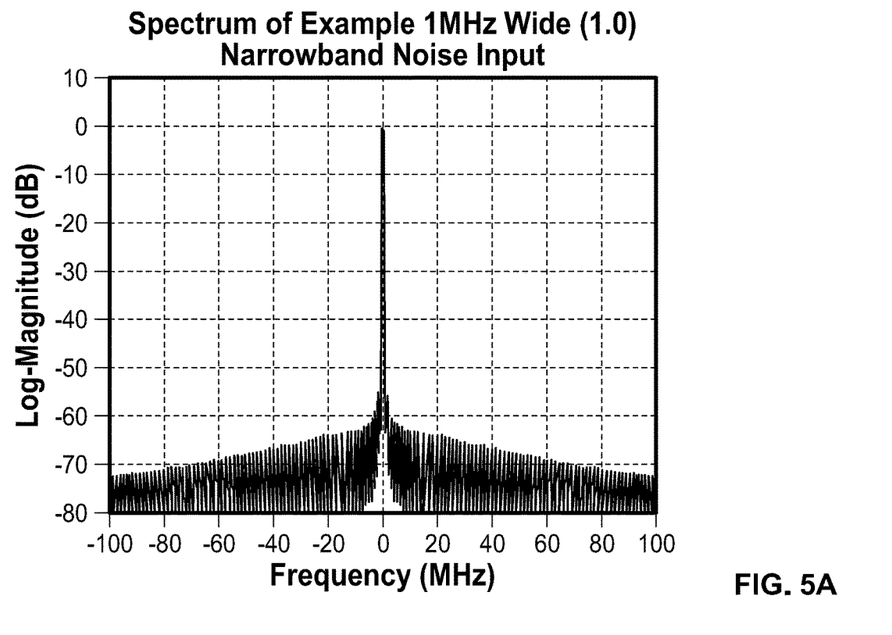
FIGS. 5A-B illustrate a spectrum of an example narrowband noise input signal in accordance with aspects of the present disclosure.
Figure 5B:
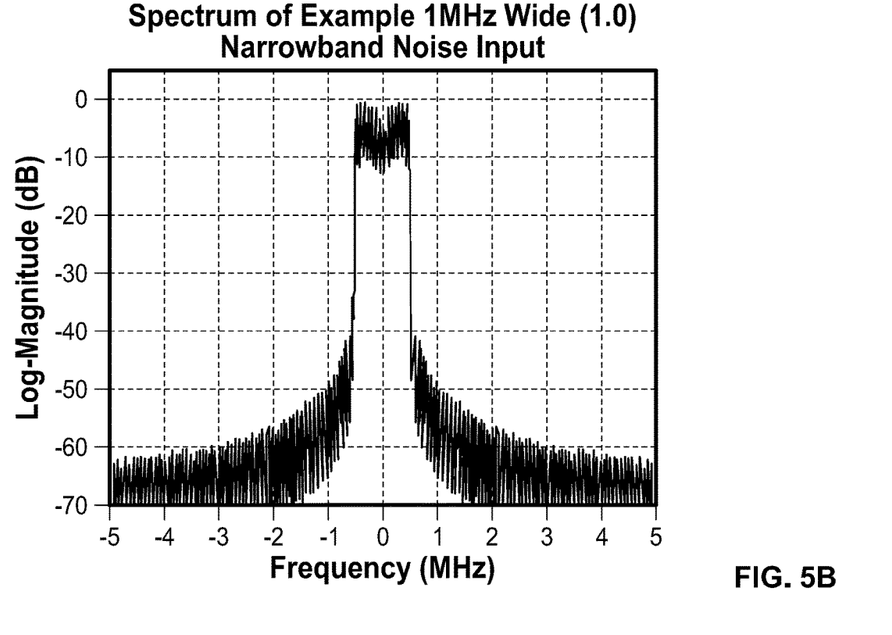

FIGS. 5A-B illustrate a spectrum of an example narrowband noise input signal 214 in accordance with aspects of the present disclosure.

As shown in FIG. 5A, narrowband noise input signal 214 occupies a limited bandwidth compared to the full span of desired noise signal 218. FIG. 5B shows narrowband noise input signal 214 in greater detail, with transitions clearly at −0.5 and 0.5 MHz. In this non-limiting example, narrowband noise input signal 214 is sampled close to its Nyquist limit at 1 Msps.

FIGS. 5A-B illustrate narrowband noise input signal 214 that is being fed into synthesizer block 206. Synthesizer block 206 can be seen as a high-coefficient lowpass filter which is designed for good passband, transition, and stopband characteristics. Characteristics of this example embodiment of the lowpass filter will now be discussed with reference to FIG. 6.

Figure 6:
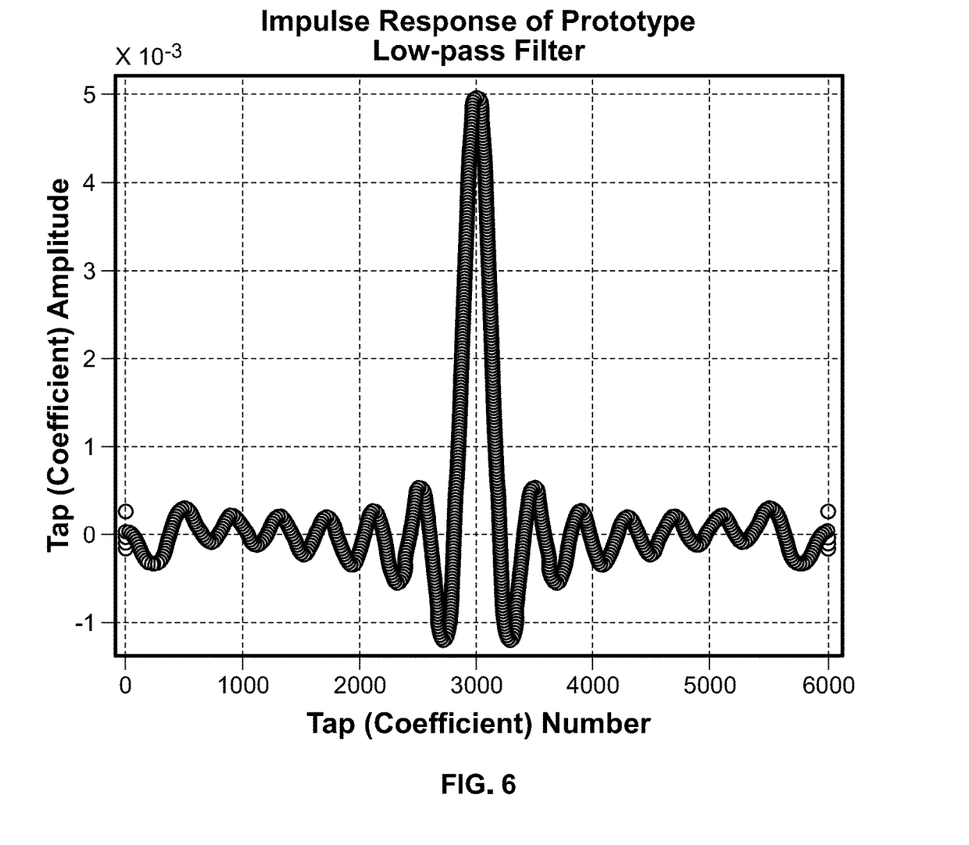
FIG. 6 illustrates an impulse response of an example lowpass filter in accordance with aspects of the present disclosure.

FIG. 6 illustrates an impulse response of an example high-coefficient lowpass filter in accordance with aspects of the present disclosure.

As shown in the figure, the lowpass filter has 6000 taps, or coefficients.

Figure 7A:
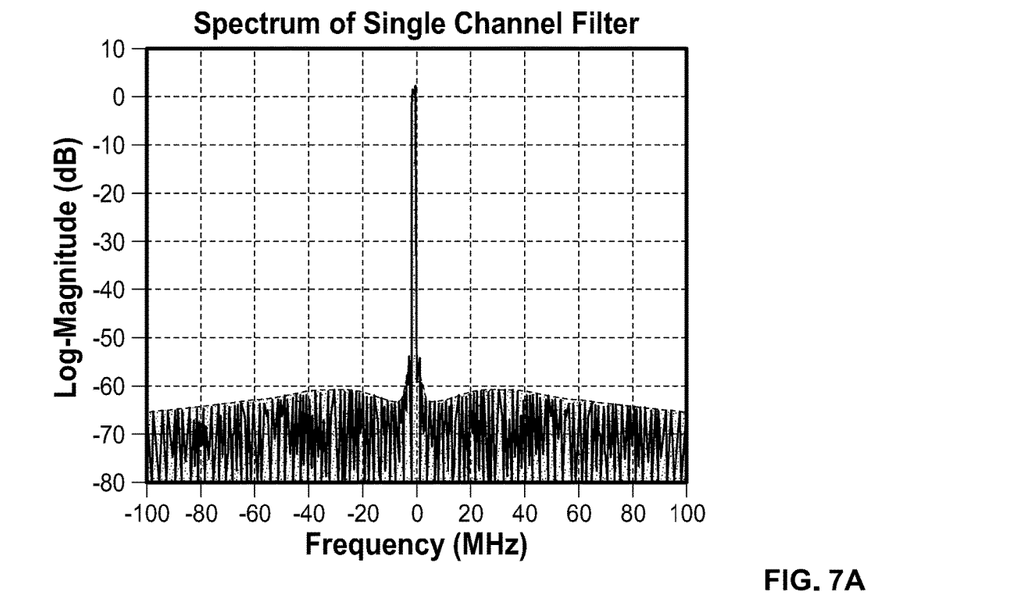
FIGS. 7A-B illustrate a frequency response of the example lowpass filter in accordance with aspects of the present disclosure.
Figure 7B:
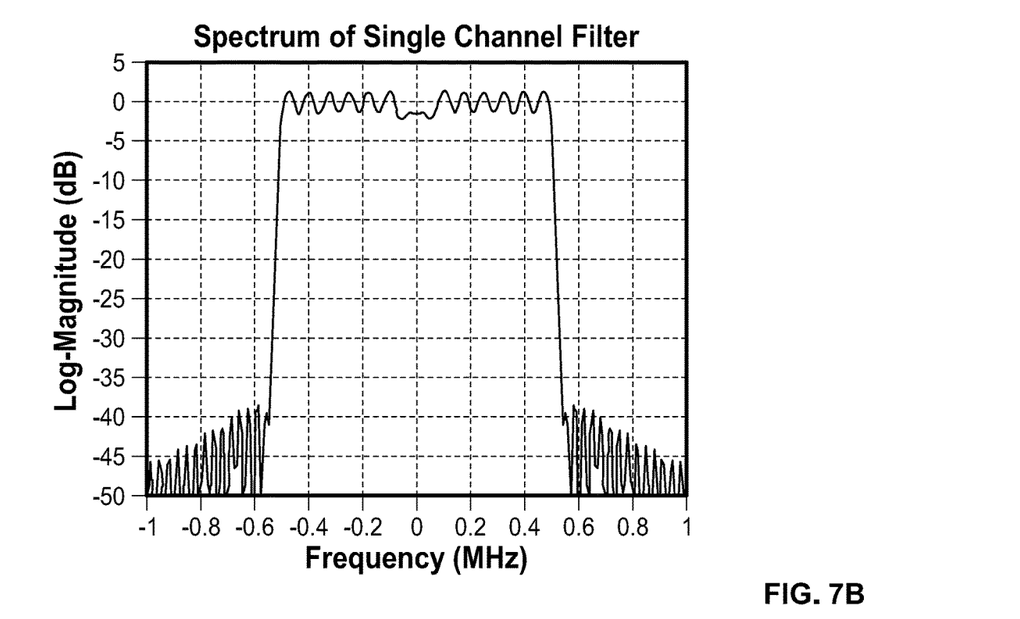

FIGS. 7A-B illustrate the frequency response of the example high-coefficient lowpass filter in accordance with aspects of the present disclosure.

FIG. 7A illustrates the narrowness and stopband attenuation of the example high-coefficient lowpass filter. FIG. 7B shows the frequency response of the high-coefficient lowpass filter in greater detail, illustrating good passband performance.

Figure 8A:
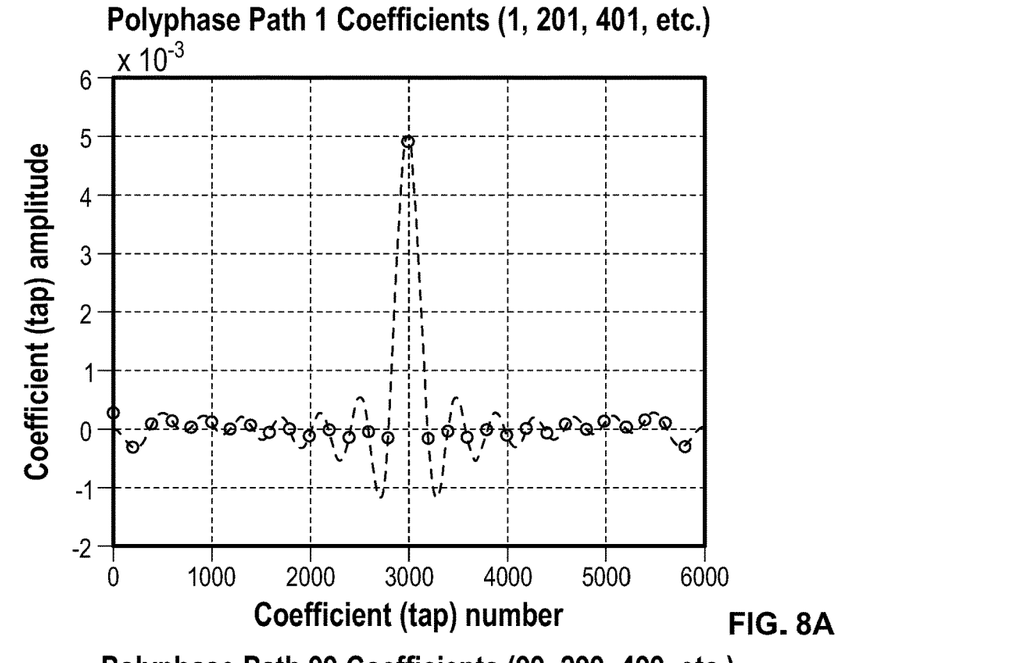
FIGS. 8A-B illustrate coefficients for example polyphase filters in accordance with aspects of the present disclosure.
Figure 8B:
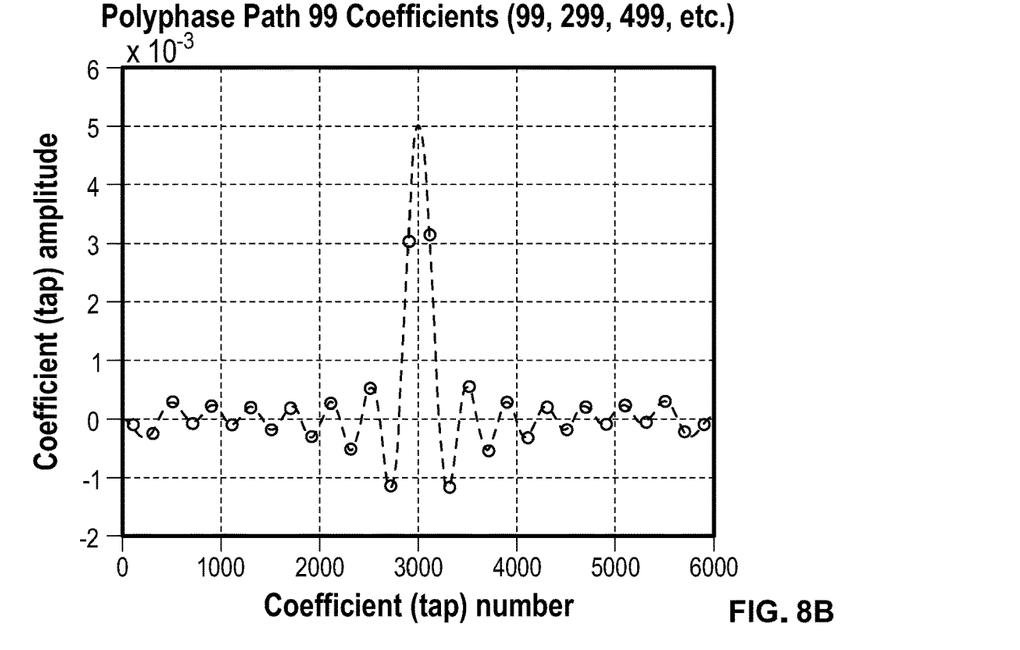

FIGS. 8A-B illustrate coefficients for example polyphase filters in accordance with aspects of the present disclosure.

As shown in the figures, coefficients from the impulse response illustrated in FIG. 6 are commutated among the polyphase filters. In this example embodiment, N=200 and there are 200 polyphase filters. FIG. 8A illustrates coefficients for polyphase filter 1; specifically, coefficients 1, 201, 401, and so on are assigned to polyphase filter 1. FIG. 8B illustrates coefficients for polyphase filter 99; specifically, coefficients 99, 299, 499, and so on are assigned to polyphase filter 99.

Referring to FIG. 3, desired noise signal 218 contains N/2 possible frequency spots that are filtered with the high-coefficient lowpass filter. Aspects of desired noise signal 218 will now be discussed with reference to FIGS. 9A-B.

Figure 9A:
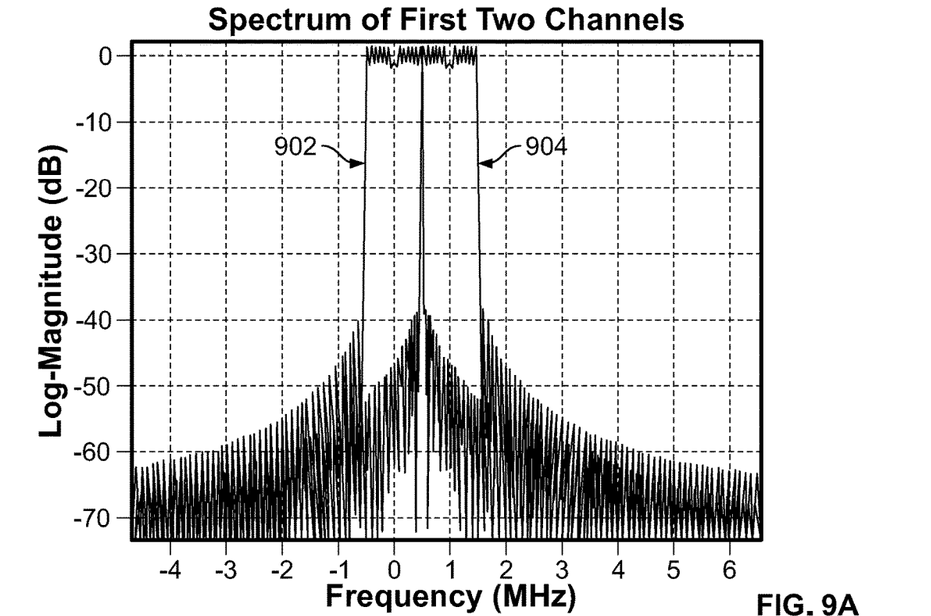
FIGS. 9A-B illustrate spectra of example output channels in accordance with aspects of the present disclosure.
Figure 9B:
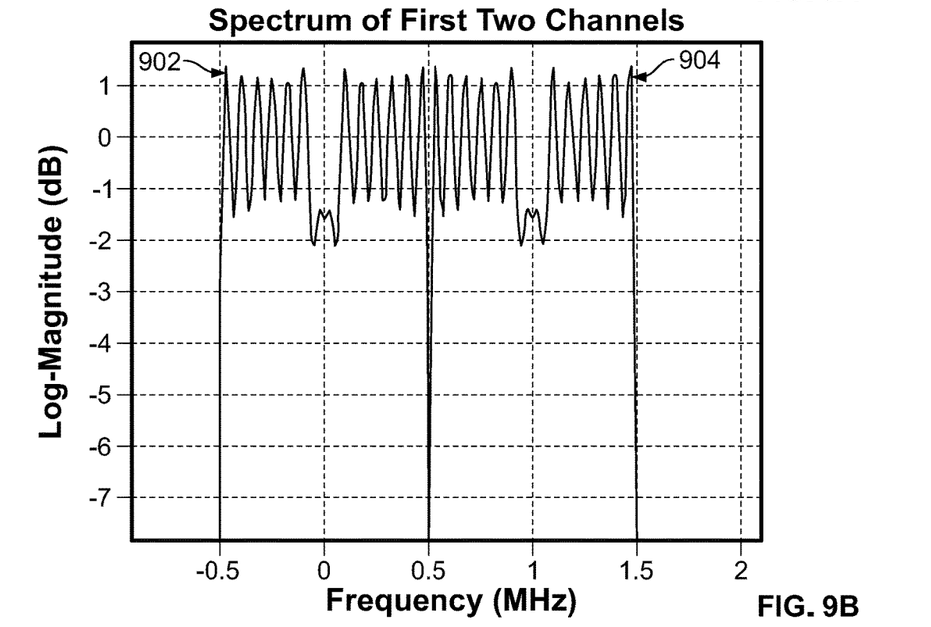

FIGS. 9A-B illustrate spectra of example output channels in accordance with aspects of the present disclosure.

In this example embodiment, spot noise generator 200 generates N/2=100 possible frequency spots spaced at 1 MHz intervals. As shown in FIG. 9A, trace 902 depicts the first channel of desired noise signal 218 and is centered at 0 MHz. Trace 904 depicts the second channel of desired noise signal 218 and is centered at 1 MHz. FIG. 9B illustrates traces 902 and 904 in more detail.

Figure 10A:
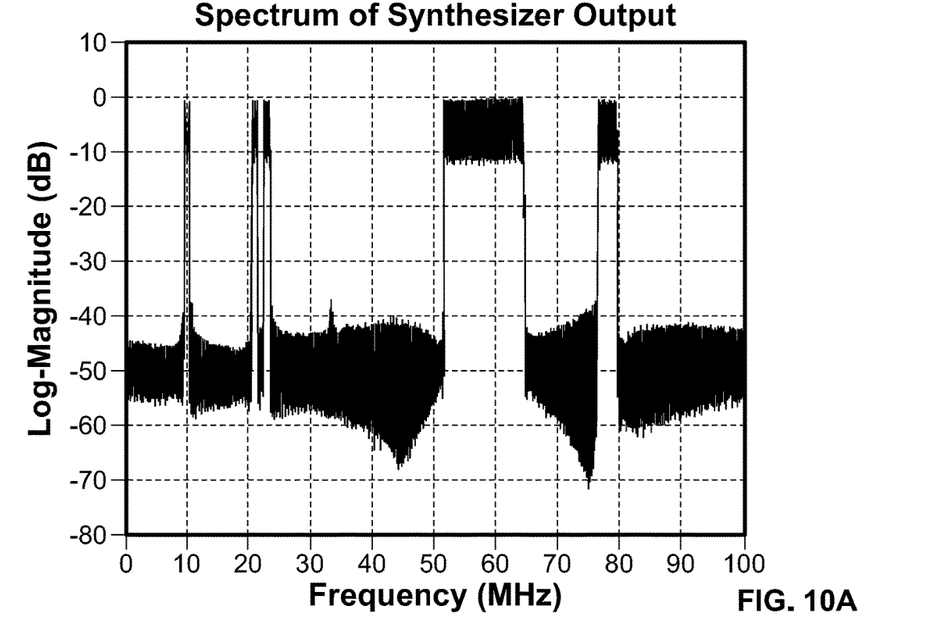
FIGS. 10A-B illustrate example spectra of the spot noise generator in accordance with aspects of the present disclosure.
Figure 10B:
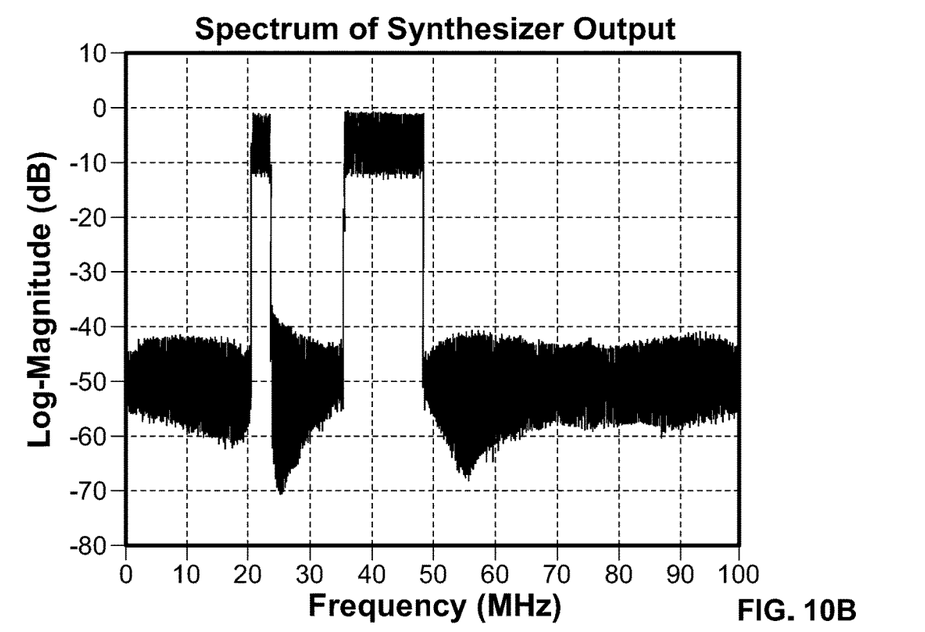

FIGS. 10A-B illustrate example spectra of spot noise generator 200 in accordance with aspects of the present disclosure.

In this example embodiment, at time t0, desired frequency channels word 216 is set to map narrowband noise input signal 214 to the following center frequencies: 10, 21, 23, 52-64, and 77-79 MHz. The spectrum of desired noise signal 218 at time t0 is shown in FIG. 10A. At time $t_1$, desired frequency channels word 216 is set to map narrowband noise input signal 214 to the following center frequencies: 21-23 and 36-48 MHz. The spectrum of desired noise channel 218 at time $t_1$ is shown in FIG. 10B.

In other words, returning to FIG. 3: desired frequency channels word input 222 of mask component 208 is operable to receive a second desired frequency channels word; first channel output 301 is further operable to output a subsequent first channel output signal; second channel output 303 is further operable to output a subsequent second channel output signal; $N^{th}$ channel output 305 is further operable to output a subsequent $N^{th}$ channel output signal; the second desired frequency channels word is operable to select one of the group consisting of first channel output 301, second channel output 303, $N^{th}$ channel output 305 and the combination of first channel output 301, second channel output 303 and $N^{th}$ channel output 305.

Further, polyphase synthesizer 210 is further operable: to synthesize the subsequent first channel output signal; to synthesize the subsequent second channel output signal; to synthesize the subsequent $N^{th}$ channel output signal; and to output a subsequent desired noise signal based on the synthesized subsequent first channel output signal, the synthesized subsequent second channel output signal and the subsequent $N^{th}$ channel output signal. More specifically, FFT component 302 is further operable to receive the subsequent first channel output signal, to receive the subsequent second channel output signal, to receive the subsequent $N^{th}$ channel output signal, to perform a fast Fourier transform on the subsequent first channel output signal, to perform a fast Fourier transform on the subsequent second channel output signal, to perform a fast Fourier transform on the subsequent $N^{th}$ channel output signal, to output a subsequent first transformed signal based on the subsequent first channel output signal, to output a subsequent second transformed signal based on the subsequent second channel output signal and to output a subsequent $N^{th}$ transformed signal based on the subsequent $N^{th}$ channel output signal. First polyphase filter 306 is further operable to generate a subsequent first polyphase filter signal based on the subsequent first transformed signal and the first weighting coefficient. Second polyphase filter 308 is further operable to generate a subsequent second polyphase filter signal based on the subsequent second transformed signal and the second weighting coefficient. $N^{th}$ polyphase filter 310 is further operable to generate a subsequent $N^{th}$ polyphase filter signal based on the subsequent $N^{th}$ transformed signal and the $N^{th}$ weighting coefficient. Interleaving component 304 is further operable to output the subsequent desired noise signal by interleaving the subsequent first polyphase filter signal, the subsequent second polyphase filter signal and the subsequent $N^{th}$ polyphase filter signal.

By comparing FIG. 10A with FIG. 10B, it is clear that the desired noise signal from time to is different from the subsequent desired noise signal from time $t_1$.

FIGS. 10A-B illustrate how desired noise signal 218 can be changed by simply modifying desired frequency channels word 216.

As shown in FIGS. 10A-B, out-of-band suppression is approximately 40 dB. Spot noise generator 200 is also able to achieve sharp roll-off and good synthesis of adjacent channels while being computationally efficient. In this non-limiting example, spot noise generator 200 operates with a lowpass filter having 6000 coefficients running at a sampling rate of 1 Msps. Prior art systems that achieve similar spectral sharpness would require 19× more coefficients at 200× the sampling rate.

In summary, RF noise is used in military and commercial applications where RF tests or transmissions require a certain level of intentional noise at desired frequency bands. Limiting the noise to specific frequency bands, or spots, saves amplifier power and prevents interference from adjacent channels. Prior art methods of generating spot noise suffer from several disadvantages: some methods are computationally expensive and do not allow the spectrum to be changed in real-time, while other methods exhibit poor out-of-band performance and waste amplifier power.

The invention presents a system and method of generating spot noise that can be dynamically tuned, is computationally efficient, and generates a clean power-efficient spectrum.

The foregoing description of various preferred embodiments has been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A spot noise generator comprising:
    a mask component having a narrowband noise input, a desired frequency channels word input, a first channel output and a second channel output, said narrowband noise input being operable to receive a narrowband noise input signal, said desired frequency channels word input being operable to receive a desired frequency channels word, said first channel output being operable to output a first channel output signal, said second channel output being operable to output a second channel output signal, the narrowband noise input signal being a digital narrowband noise signal sampled approximately at the Nyquist rate, the desired frequency channels word being operable to select one of the group consisting of the first channel output, the second channel output and a combination of the first channel output and the second channel output;
    a polyphase synthesizer operable to synthesize the first channel output signal, to synthesize the second channel output signal and to output a desired noise signal based on the synthesized first channel output signal and the synthesized second channel output signal;
    a first signal channel operable to provide the first channel output signal from said first channel output to said polyphase synthesizer; and
    a second signal channel operable to provide the second channel output signal from said second channel output to said polyphase synthesizer.

2. The spot noise generator of claim 1,
    wherein said desired frequency channels word input is further operable to receive a second desired frequency channels word, said first channel output is further operable to output a subsequent first channel output signal, said second channel output is further operable to output a subsequent second channel output signal, the second desired frequency channels word being operable to select one of the group consisting of the first channel output, the second channel output and the combination of the first channel output and the second channel output,
    wherein said polyphase synthesizer is further operable to synthesize the subsequent first channel output signal, to synthesize the subsequent second channel output signal and to output a subsequent desired noise signal based on the synthesized subsequent first channel output signal and the synthesized subsequent second channel output signal, and
    wherein the desired noise signal is different from the subsequent desired noise signal.

3. The spot noise generator of claim 2, wherein said polyphase synthesizer comprises:
    a fast Fourier transform component operable to receive the first channel output signal, to receive the second channel output signal, to perform a fast Fourier transform on the first channel output signal, to perform a fast Fourier transform signal on the second channel output signal, to output a first transformed signal based on the first channel output signal and to output a second transformed signal based on the second channel output signal;
    a first polyphase filter having a first weighting coefficient, said first polyphase filter being operable to generate a first polyphase filter signal based on the first transformed signal and the first weighting coefficient;
    a second polyphase filter having a second weighting coefficient, said second polyphase filter being operable to generate a second polyphase filter signal based on the second transformed signal and the second weighting coefficient; and
    an interleaving component operable to output the desired noise signal by interleaving the first polyphase filter signal and the second polyphase filter signal.

4. The spot noise generator of claim 3,
    wherein said fast Fourier transform component is further operable to receive the subsequent first channel output signal, to receive the subsequent second channel output signal, to perform a fast Fourier transform on the subsequent first channel output signal, to perform a fast Fourier transform on the subsequent second channel output signal, to output a subsequent first transformed signal based on the subsequent first channel output signal and to output a subsequent second transformed signal based on the subsequent second channel output signal,
    wherein said first polyphase filter is further operable to generate a subsequent first polyphase filter signal based on the subsequent first transformed signal and the first weighting coefficient,
    wherein said second polyphase filter is further operable to generate a subsequent second polyphase filter signal based on the subsequent second transformed signal and the second weighting coefficient, and
    wherein said interleaving component is further operable to output the subsequent desired noise signal by interleaving the subsequent first polyphase filter signal and the subsequent second polyphase filter signal.

5. The spot noise generator of claim 4, wherein said mask component is operable to output the first channel output signal having a frequency resolution of approximately 1 MHz.

6. The spot noise generator of claim 2, wherein said mask component is operable to output the first channel output signal having a frequency resolution of approximately 1 MHz.

7. The spot noise generator of claim 1, wherein said polyphase synthesizer comprises:
    a fast Fourier transform component operable to receive the first channel output signal, to receive the second channel output signal, to perform a fast Fourier transform on the first channel output signal, to perform a fast Fourier transform signal on the second channel output signal, to output a first transformed signal based on the first channel output signal and to output a second transformed signal based on the second channel output signal;

a first polyphase filter having a first weighting coefficient, said first polyphase filter being operable to generate a first polyphase filter signal based on the first transformed signal and the first weighting coefficient;

a second polyphase filter having a second weighting coefficient, said second polyphase filter being operable to generate a second polyphase filter signal based on the second transformed signal and the second weighting coefficient; and an interleaving component operable to output the desired noise signal by interleaving the first polyphase filter signal and the second polyphase filter signal.

8. A method of generating a spot noise signal, said method comprising:

receiving, at a mask component having a narrowband noise input, a desired frequency channels word input, a first channel output and a second channel output, a narrowband noise input signal at the narrowband noise input, the narrowband noise input signal being a digital narrowband noise signal sampled approximately at the Nyquist rate;

receiving, at the desired frequency channels word input, a desired frequency channels word that is operable to select one of the group consisting of the first channel output, the second channel output and a combination of the first channel output and the second channel output;

outputting, one of the group consisting of a first channel output signal on the first channel output, a second channel output signal on the second channel output and a combination of the first channel output signal on the first channel output and the second channel output signal on the second channel output, based on the desired frequency channels word;

providing, via a first signal channel, the first channel output signal from the first channel output to a polyphase synthesizer;

providing, via a second signal channel, the second channel output signal from the second channel output to the polyphase synthesizer synthesizing, via the polyphase synthesizer, the first channel output signal;

synthesizing, via the polyphase synthesizer, the second channel output signal; and outputting, via the polyphase synthesizer, a desired noise signal based on the synthesized first channel output signal and the synthesized second channel output signal.

9. The method of claim 8, further comprising:

receiving, at the desired frequency channels word input, a second desired frequency channels word that is operable to select one of the group consisting of the first channel output, the second channel output and the combination of the first channel output and the second channel output;

outputting, via the first channel output, a subsequent first channel output signal;

outputting, via the second channel output, a subsequent second channel output signal;

synthesizing, via the polyphase synthesizer, the subsequent first channel output signal;

synthesizing, via the polyphase synthesizer, the subsequent second channel output signal; and outputting, via the polyphase synthesizer, a subsequent desired noise signal based on the synthesized subsequent first channel output signal and the synthesized subsequent second channel output signal, wherein the desired noise signal is different from the subsequent desired noise signal.

10. The method of claim 9, wherein said providing, via a first signal channel, the first channel output signal from the first channel output to a polyphase synthesizer comprises providing the first channel output signal from the first channel output to a polyphase synthesizer comprising:

a fast Fourier transform component operable to receive the first channel output signal, to receive the second channel output signal, to perform a fast Fourier transform on the first channel output signal, to perform a fast Fourier transform signal on the second channel output signal, to output a first transformed signal based on the first channel output signal and to output a second transformed signal based on the second channel output signal;

a first polyphase filter having a first weighting coefficient, the first polyphase filter being operable to generate a first polyphase filter signal based on the first transformed signal and the first weighting coefficient;

a second polyphase filter having a second weighting coefficient, the second polyphase filter being operable to generate a second polyphase filter signal based on the second transformed signal and the second weighting coefficient; and an interleaving component operable to output the desired noise signal by interleaving the first polyphase filter signal and the second polyphase filter signal.

11. The method of claim 10, further comprising:

receiving, via wherein the fast Fourier transform component, the subsequent first channel output signal;

receiving, via the fast Fourier transform component, the subsequent second channel output signal;

performing, via the fast Fourier transform component, a fast Fourier transform on the subsequent first channel output signal;

performing, via the fast Fourier transform component, a fast Fourier transform on the subsequent second channel output signal;

outputting, via the fast Fourier transform component, a subsequent first transformed signal based on the subsequent first channel output signal;

outputting, via the fast Fourier transform component, output a subsequent second transformed signal based on the subsequent second channel output signal;

generating, via the first polyphase filter, generate a subsequent first polyphase filter signal based on the subsequent first transformed signal and the first weighting coefficient;

generating, via the second polyphase filter, a subsequent second polyphase filter signal based on the subsequent second transformed signal and the second weighting coefficient; and outputting, via the interleaving component, the subsequent desired noise signal by interleaving the subsequent first polyphase filter signal and the subsequent second polyphase filter signal.

12. The method of claim 11, wherein said outputting, one of the group consisting of a first channel output signal on the first channel output, a second channel output signal on the second channel output and a combination of the first channel output signal on the first channel output and the second channel output signal on the second channel output, based on the desired frequency channels word comprises outputting the first channel output signal having a frequency resolution of approximately 1 MHz.

13. The method of claim 9, wherein said outputting, one of the group consisting of a first channel output signal on the first channel output, a second channel output signal on the second channel output and a combination of the first channel output signal on the first channel output and the second channel output signal on the second channel output, based on the desired frequency channels word comprises outputting the first channel output signal having a frequency resolution of approximately 1 MHz.

14. The method of claim 8,
wherein said providing, via a first signal channel, the first channel output signal from the first channel output to a polyphase synthesizer comprises providing the first channel output signal from the first channel output to a polyphase synthesizer comprising:
a fast Fourier transform component operable to receive the first channel output signal, to receive the second channel output signal, to perform a fast Fourier transform on the first channel output signal, to perform a fast Fourier transform signal on the second channel output signal, to output a first transformed signal based on the first channel output signal and to output a second transformed signal based on the second channel output signal;
a first polyphase filter having a first weighting coefficient, the first polyphase filter being operable to generate a first polyphase filter signal based on the first transformed signal and the first weighting coefficient;
a second polyphase filter having a second weighting coefficient, the second polyphase filter being operable to generate a second polyphase filter signal based on the second transformed signal and the second weighting coefficient; and
an interleaving component operable to output the desired noise signal by interleaving the first polyphase filter signal and the second polyphase filter signal.

15. A non-transitory, tangible, computer-readable media having computer-readable instructions stored thereon, the computer-readable instructions being capable of being read by a computer and being capable of instructing the computer to perform a method of generating a spot noise signal comprising:
receiving, at a mask component having a narrowband noise input, a desired frequency channels word input, a first channel output and a second channel output, a narrowband noise input signal at the narrowband noise input, the narrowband noise input signal being a digital narrowband noise signal sampled approximately at the Nyquist rate;
receiving, at the desired frequency channels word input, a desired frequency channels word that is operable to select one of the group consisting of the first channel output, the second channel output and a combination of the first channel output and the second channel output;
outputting, one of the group consisting of a first channel output signal on the first channel output, a second channel output signal on the second channel output and a combination of the first channel output signal on the first channel output and the second channel output signal on the second channel output, based on the desired frequency channels word;
providing, via a first signal channel, the first channel output signal from the first channel output to a polyphase synthesizer;
providing, via a second signal channel, the second channel output signal from the second channel output to the polyphase synthesizer synthesizing, via the polyphase synthesizer, the first channel output signal;
synthesizing, via the polyphase synthesizer, the second channel output signal; and
outputting, via the polyphase synthesizer, a desired noise signal based on the synthesized first channel output signal and the synthesized second channel output signal.

16. The non-transitory, tangible, computer-readable media of claim 15, wherein the computer-readable instructions are capable of instructing the computer to perform the method, further comprising:
receiving, at the desired frequency channels word input, a second desired frequency channels word that is operable to select one of the group consisting of the first channel output, the second channel output and the combination of the first channel output and the second channel output;
outputting, via the first channel output, a subsequent first channel output signal;
outputting, via the second channel output, a subsequent second channel output signal;
synthesizing, via the polyphase synthesizer, the subsequent first channel output signal;
synthesizing, via the polyphase synthesizer, the subsequent second channel output signal; and
outputting, via the polyphase synthesizer, a subsequent desired noise signal based on the synthesized subsequent first channel output signal and the synthesized subsequent second channel output signal,
wherein the desired noise signal is different from the subsequent desired noise signal.

17. The non-transitory, tangible, computer-readable media of claim 16, wherein the computer-readable instructions are capable of instructing the computer to perform the method wherein said providing, via a first signal channel, the first channel output signal from the first channel output to a polyphase synthesizer comprises providing the first channel output signal from the first channel output to a polyphase synthesizer comprising:
a fast Fourier transform component operable to receive the first channel output signal, to receive the second channel output signal, to perform a fast Fourier transform on the first channel output signal, to perform a fast Fourier transform signal on the second channel output signal, to output a first transformed signal based on the first channel output signal and to output a second transformed signal based on the second channel output signal;
a first polyphase filter having a first weighting coefficient, the first polyphase filter being operable to generate a first polyphase filter signal based on the first transformed signal and the first weighting coefficient;
a second polyphase filter having a second weighting coefficient, the second polyphase filter being operable to generate a second polyphase filter signal based on the second transformed signal and the second weighting coefficient; and
an interleaving component operable to output the desired noise signal by interleaving the first polyphase filter signal and the second polyphase filter signal.

18. The non-transitory, tangible, computer-readable media of claim 17, wherein the computer-readable instructions are capable of instructing the computer to perform the method, further comprising:
receiving, via wherein the fast Fourier transform component, the subsequent first channel output signal;

receiving, via the fast Fourier transform component, the subsequent second channel output signal;
performing, via the fast Fourier transform component, a fast Fourier transform on the subsequent first channel output signal;
performing, via the fast Fourier transform component, a fast Fourier transform on the subsequent second channel output signal;
outputting, via the fast Fourier transform component, a subsequent first transformed signal based on the subsequent first channel output signal;
outputting, via the fast Fourier transform component, output a subsequent second transformed signal based on the subsequent second channel output signal;
generating, via the first polyphase filter, generate a subsequent first polyphase filter signal based on the subsequent first transformed signal and the first weighting coefficient;
generating, via the second polyphase filter, a subsequent second polyphase filter signal based on the subsequent second transformed signal and the second weighting coefficient; and
outputting, via the interleaving component, the subsequent desired noise signal by interleaving the subsequent first polyphase filter signal and the subsequent second polyphase filter signal.

19. The non-transitory, tangible, computer-readable media of claim 18, wherein the computer-readable instructions are capable of instructing the computer to perform the method wherein said outputting, one of the group consisting of a first channel output signal on the first channel output, a second channel output signal on the second channel output and a combination of the first channel output signal on the first channel output and the second channel output signal on the second channel output, based on the desired frequency channels word comprises outputting the first channel output signal having a frequency resolution of approximately 1 MHz.

20. The non-transitory, tangible, computer-readable media of claim 16, wherein the computer-readable instructions are capable of instructing the computer to perform the method wherein said outputting, one of the group consisting of a first channel output signal on the first channel output, a second channel output signal on the second channel output and a combination of the first channel output signal on the first channel output and the second channel output signal on the second channel output, based on the desired frequency channels word comprises outputting the first channel output signal having a frequency resolution of approximately 1 MHz.

* * * * *